United States Patent
Dames et al.

(10) Patent No.: US 6,414,475 B1
(45) Date of Patent: Jul. 2, 2002

(54) CURRENT SENSOR

(75) Inventors: Andrew Nicholas Dames; Edward Crellier Colby, both of Cambridge (GB)

(73) Assignee: Sentec Ltd., Cambridgeshire (GB)

( * ) Notice: Subject to any disclaimer, the term of this patent is extended or adjusted under 35 U.S.C. 154(b) by 0 days.

(21) Appl. No.: 09/706,959

(22) Filed: Nov. 6, 2000

Related U.S. Application Data

(63) Continuation-in-part of application No. PCT/GB00/02851, filed on Jul. 24, 2000.

(30) Foreign Application Priority Data

Aug. 6, 1999 (GB) ............................................. 9918539

(51) Int. Cl.$^7$ ........................... G01R 1/14; G01R 11/32; H01E 27/34
(52) U.S. Cl. ........................ 324/127; 324/142; 333/181
(58) Field of Search ................................ 324/127, 200, 324/142, 141; 336/181; 333/12; 307/89, 90, 91

(56) References Cited

U.S. PATENT DOCUMENTS

| | | | |
|---|---|---|---|
| 4,492,919 A | 1/1985 | Milkovic | 324/127 |
| 4,749,940 A | 6/1988 | Bullock | |
| 4,794,326 A | 12/1988 | Friedl | 324/117 R |
| 4,894,610 A | 1/1990 | Friedl | 324/127 |
| 5,041,780 A | 8/1991 | Rippel | |
| 5,066,904 A * | 11/1991 | Bullock | 324/127 |
| 5,128,611 A * | 7/1992 | Konrad | 324/142 |
| 5,521,572 A | 5/1996 | Goodwin et al. | 336/178 |
| 5,701,253 A | 12/1997 | Mayell et al. | 364/483 |
| 5,736,846 A * | 4/1998 | Floru et al. | 324/127 |

FOREIGN PATENT DOCUMENTS

| | | | |
|---|---|---|---|
| EP | 0267498 A1 | 10/1987 | H01F/40/14 |
| EP | 0290951 | 11/1988 | H02M/3/28 |
| EP | 0335511 | 10/1989 | G01R/15/02 |
| EP | 0492261 A2 | 12/1991 | |
| EP | 0710844 A2 | 5/1996 | G01R/15/14 |
| JP | 01110795 | 4/1989 | H05K/3/46 |
| WO | WO 93/01502 | 1/1993 | G01R/15/02 |

OTHER PUBLICATIONS

"Analog Devices: "Application Note AN–545"", Analog Devices Inc., 6 Pages, (1998).
"Analog Devices: "Data Sheet for Product to Frequency Converter AD7750"", Analog Devices, Inc., 17 Pages, (1997).
"Analog Devices: "Preliminary Technical Data for Active Energy Metering IC With Serial Interface AD7756"", Analog Devices, Inc., 29 Pages, (1999).
Karrer, N., et al., "A New Current Probe with a Wide Bandwitdth", Eighth European Conference on Power Electronics and Applications, 10 Pages, (Sep. 7–9, 1999).

* cited by examiner

Primary Examiner—N. Le
Assistant Examiner—Anjan K. Deb
(74) Attorney, Agent, or Firm—McDermott, Will & Emery

(57) ABSTRACT

A fiscal electricity meter is described for measuring the energy supplied to a load. The load current flows through the primary winding of a transformer and induces an EMF indicative of the current flowing in the secondary winding. The secondary winding comprises a sense coil, arranged to couple more strongly to the primary, and a cancellation coil which have equal and opposite turns area products so as to provide a null response to extraneous magnetic fields. The coils are arranged so that their magnetic axis are co-located and aligned together so that they also provide a null response to extraneous magnetic fields having a field gradient.

52 Claims, 11 Drawing Sheets

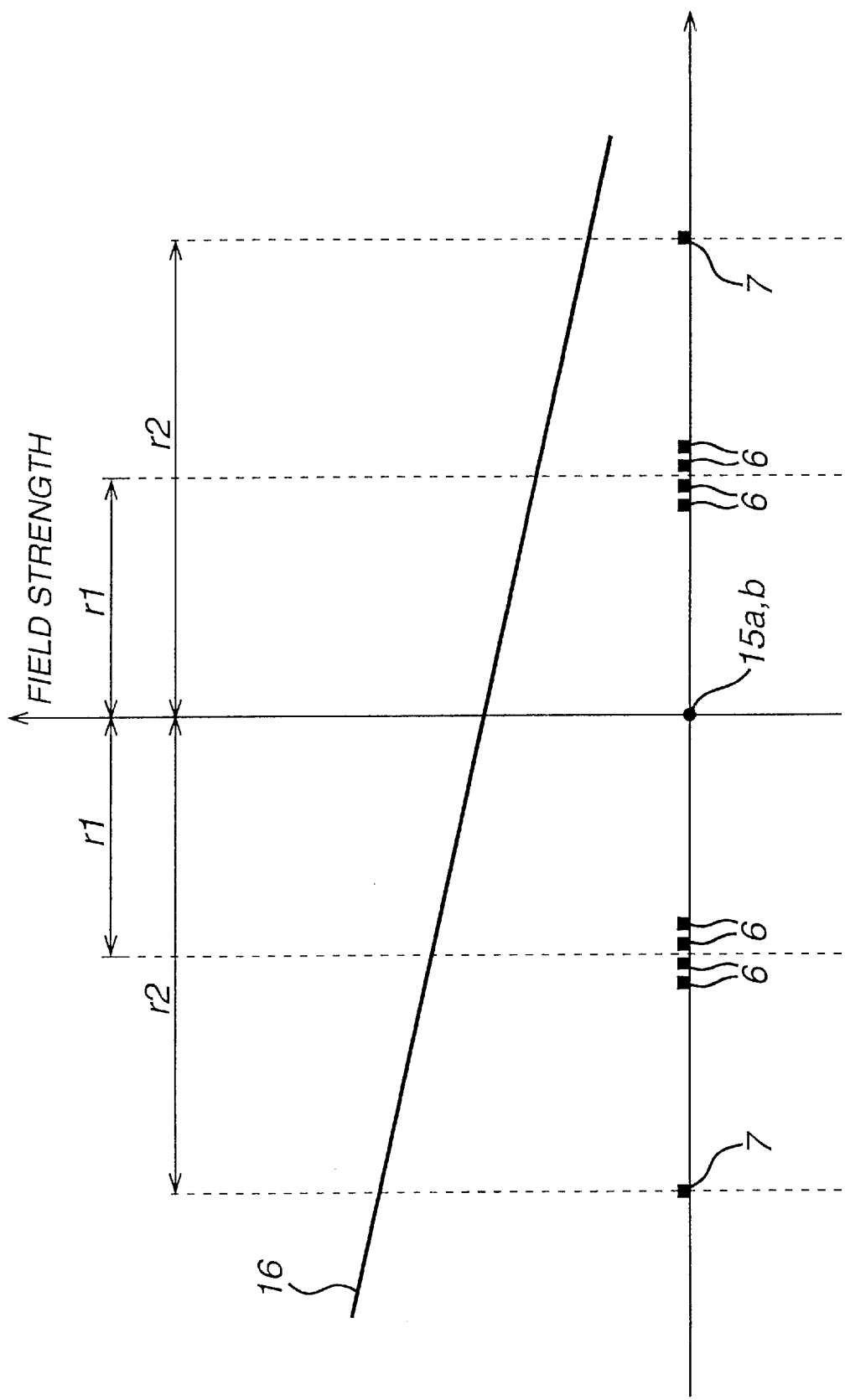

CURRENT SENSOR

This application is a Continuation-In-Part of International Patent Application Number PCT/GB00/02851, filed on Jul. 24, 2000, and Great Britain Patent Application Number 9918539.9, filed on Aug. 6, 1999, and which are incorporated herein by reference.

This invention relates to a sensor which may be used to measure the current flowing in a conductor. More particularly, but not exclusively, this invention relates to a current sensor which may form part of an alternating current (AC) fiscal electricity meter for measuring the energy supplied by a utility company to a business or residential premises.

A variety of different methods are already known for measuring current. One of these methods uses a resistor in the current path to establish a voltage across the resistor which is proportional to the current flowing through the resistor. However, this method suffers from ohmic heating of the shunt resistor and the lack of galvanic isolation between the current being measured and the voltage established.

Other methods of current measurement detect and measure the magnetic field produced by a current flowing through a conductor. These methods generally have the advantage of providing electrical isolation between the current being measured and the circuit performing the measurement. The magnetic field may be detected by a Hall sensor or by a current transformer. The use of a Hall sensor suffers from the disadvantage that Hall sensors can suffer from temperature dependence and are also relatively expensive.

U.S. Pat. No. 5,521,572 discloses an air coupled current transformer which uses two ferromagnetic pole pieces separated by a pair of extensive air gaps. However, this current transformer is not sufficiently accurate for some applications, such as fixed electricity metering, due to its sensitivity to unwanted, externally generated, magnetic field gradients. U.S. Pat. No. 5,736,846 discloses an air coupled current transformer for monitoring the load currents of an audio amplifier. However, this current transformer is also sensitive to magnetic field gradients and therefore is not sufficiently accurate for use in a fiscal electricity meter.

Therefore, both of these examples of prior art current transformer sensors are sensitive to extraneous non-uniform magnetic fields (i.e. where the field strength varies spatially) which may be caused by currents, of the same frequency as the sensed current, flowing through wires which are located in proximity to the current sensor.

Where the current sensor is used as part of a fiscal electricity meter it is particularly important that the meter is not unduly sensitive to the influence of extraneous magnetic fields. There are various published standards relating to the performance of fiscal electricity meters, for example ANSI C12-1993, "Electricity Metering" and IEC1036 second edition 1996-09. More specifically, ANSI C12.16, "Solid State Electricity Meters", Section 10.2.4 "Effect of External Magnetic Field Test No. 16", specifies the degree to which a fiscal electricity meter may be influenced by magnetic interference. The test specifies that with a current of 3 A flowing through the meter, and with the meter placed in one of three specified positions within a 1.8 meter by 1.8 meter loop, that a 100 ampere (100 A) current (of the same frequency and phase as the metered current) flowing around the loop should not alter the meter reading by more than 1%.

Accordingly there is a need for a current sensor which is low in cost, provides isolation from the current being measured, is suitable for integration with modern electronic manufacturing methods and is substantially insensitive to:

(i) magnetic fields as produced, for example, by distant (far field) magnetic sources;
(ii) non-uniform magnetic fields as produced, for example, by large currents flowing through nearby conductors (i.e. field gradients); and
(iii) magnetic fields as specified by the ANSI standard.

According to one aspect, the present invention provides a substantially planar current sensor for establishing an electromotive force proportional to the rate of change of current in a load conductor, the current sensor comprising coil portions where the electromotive force established by the coil portions is substantially equal and opposite for uniform fields from far away interfering sources and is dissimilar for local fields.

Such a sensor may be manufactured as a printed circuit board (PCB) which provides a low cost manufacturing method that can achieve excellent tolerances and hence good reproducibility on the positioning of the conductors that form the coil portions.

According to a second aspect, the present invention provides an electricity meter comprising: an inlet for receiving supply current from an electricity supply; an outlet for outputting the supply current to a load; a primary conductor connected between the inlet and the outlet for providing a current path for the supply current through the meter; a current sensor for sensing and for outputting a measure of the supply current flowing through the primary conductor; means for providing a measure of the voltage of the electricity supply; and means for determining and outputting an indication of energy consumed by the load in dependence upon the current measure and the voltage measure; characterised in that said current sensor comprises a sensing coil having: (a) an inner sensing coil portion having a plurality of conductive turns located in substantially the same plane and having a magnetic centre defined by the configuration of the conductive turns; and (b) an outer sensing coil portion having at least one conductive turn located substantially in the same plane as the conductive turns of the inner sensing coil portion and having a magnetic centre defined by the configuration of the at least one conductive turn; wherein the inner and outer sensing coil portions have substantially equal turns area products, are connected in series and are arranged so that (i) EMFs induced in the inner and outer sensing coil portions by a common background alternating magnetic field oppose each other; and so that (ii) their effective magnetic centres are substantially co-located; wherein said primary conductor has a loop portion which is located adjacent one of said inner and outer sensing coil portions and which lies in a plane substantially parallel to the plane in which the sensing coil portions lie; and wherein the arrangement of the primary conductor and said sensing coil is such that in response to a current flowing in the primary conductor, a signal is induced in said sensing coil which varies in dependence upon the current flowing in the primary conductor.

Exemplary embodiments of the present invention will now be described with reference to the accompanying drawings in which:

FIG. 3b is a cross-sectional view, through section XX' of FIG. 1, illustrating a magnetic field (as produced by a local magnetic source) varying linearly in strength across the plane of the coil arrangement of FIG. 2;

Figure 1:
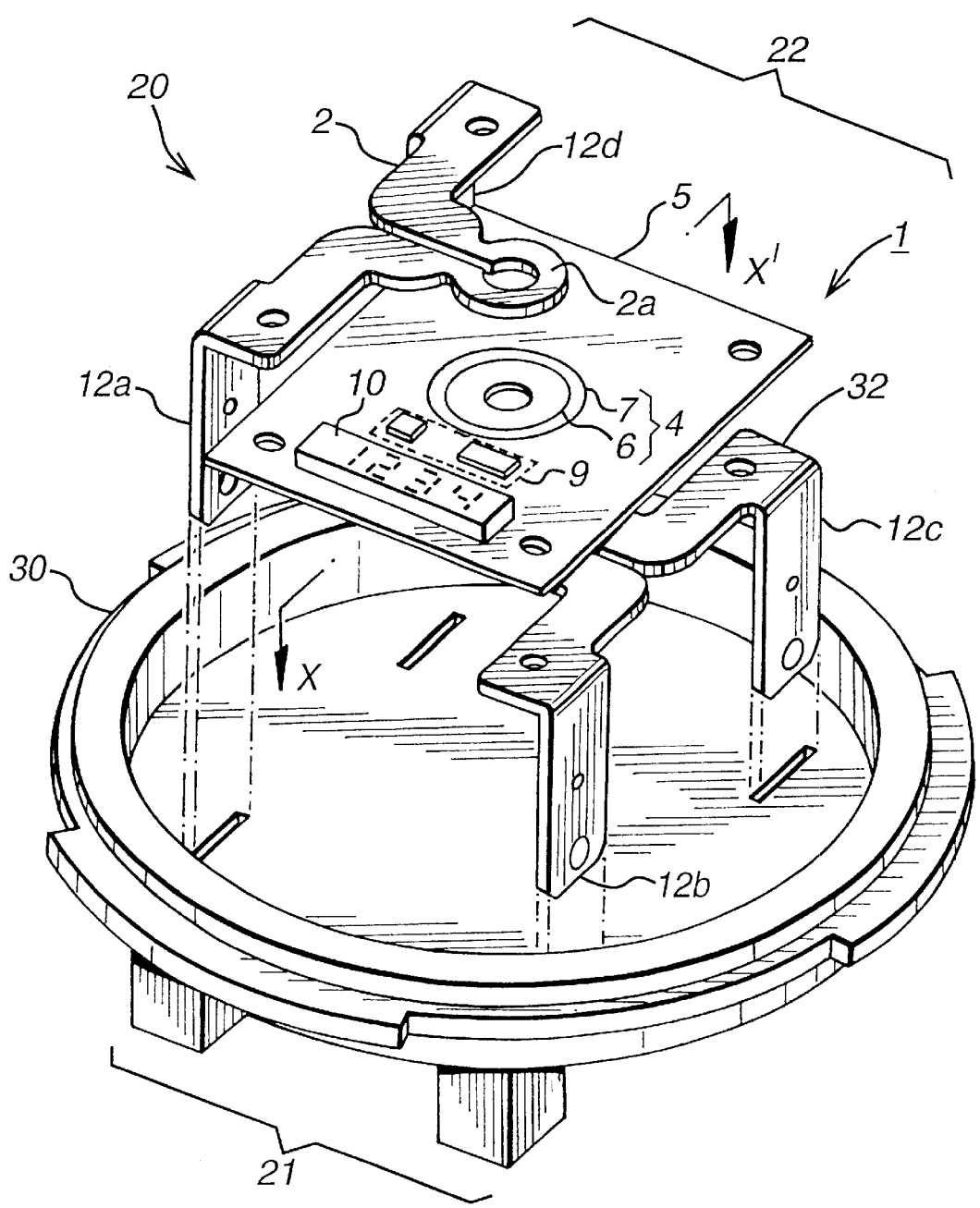
FIG. 1 is an exploded perspective view of part of a fiscal electricity meter, suitable for use in the USA, incorporating two load conductors and a current sensor.

FIG. 1 shows a partially exploded view of a fiscal electricity meter 20 comprising a meter base 30, a mains input 21, a mains output 22 and a current sensor 1. The current sensor 1 comprises a first load conductor 2 and a second load conductor 32, which are connected between the mains input 21 and the mains output 22 and through which the mains current flows. The mains input 21 may be connected to a "2S" 3 wire format, 240 volt (120 V) root-mean-square (RMS) 60 hertz (60 Hz) single phase centre tapped mains supply as commonly used in the USA for residential premises, from which a current of 0 A to 200 A RMS may be drawn. The mains output 22 may be connected to a residential premises. The current sensor 1 also comprises a sensor PCB 5 on which is formed a current sensing coil 4 comprising a sense portion 6 and a cancellation portion 7. In this embodiment, the sense portion 6 is annular and lies coaxially within the cancellation portion 7, which is also annular. Mounted on the sensor PCB 5 is sensor circuitry 9 for processing the output from the current sensing coil 4, and a liquid crystal display (LCD) 10 for displaying cumulative energy (in kilowatt hours) drawn from the mains.

In this embodiment, the load conductors 2, 32 are made of copper and have a thickness of 2.5 millimeters (2.5 mm) and a width of 5 mm. As illustrated in FIG. 1, load conductor 2 is shaped to have a loop portion 2a having an inner diameter of 9.8 mm and an outer diameter similar to that of the outer diameter of the sense portion 6. Although not visible due to obscuration by the sensor PCB 5, the load conductor 32 also has a loop portion which is substantially identical to that of the load conductor 2. As illustrated in FIG. 1, the load conductors and the PCB 5 are arranged so that the line through the effective magnetic centres of the loop portions is substantially normal to the sensor PCB 5. With a 2S 3 wire format supply, most of the current will (in general) flow through either the load conductor 2, or the load conductor 32, to loads that are connected to a neutral conductor; the return current from these loads to the supply is via the neutral conductor (the neutral wire is the "third" wire of the 2S format supply and is not connected to the meter). Other currents may flow from the load conductor 2 via a load to the load conductor 32 without returning to the supply via the neutral conductor. The electrical connections at the mains input 21 and mains output 22 are via blade portions 12a,b, c,d of width 19.5 mm. The blade portions are connected to their appropriate load conductors 2,32 via 12 mm wide copper conductors.

In this embodiment, the sensor PCB 5 is insulated from the load conductors 2, 32 using insulating sheets (not shown) between it and the load conductors. An insulated non-ferrous clamping bolt (not shown) is used to clamp the load conductors 2, 32, the insulating sheets, and the sensor PCB 5 together. Electrostatic shields, (not shown) are also provided between the load conductors 2,32 and the current sensor PCB 5 for reducing capacitive coupling of mains-borne interference (or of the AC mains voltage potential) from the load conductors 2, 32 to the current sensing coil 4.

Overview of Operation

In operation, AC current flowing between the mains input 21 and the mains output 22 flows through the loop portions of the load conductors 2, 32 and so establishes a time-varying magnetic field in the vicinity of the sensing coil 4. This magnetic field induces an electromotive force (EMF) in the coil 4 which is proportional to the current flowing in the load conductors 2, 32. The induced EMF is then processed by the sensor circuitry 9 in order to measure the current flowing in the load conductors 2, 32. The current measurement is then combined with a measurement of the voltage between the load conductors 2,32 to derive a measure of the instantaneous power used by a load connected (via the load conductors 2,32) to the mains output 22. The instantaneous power is integrated with respect to time in order to determine the energy consumed by the load. This energy consumed is then displayed on the LCD display 10 in kilowatt-hours.

Sensor PCB

Figure 2:
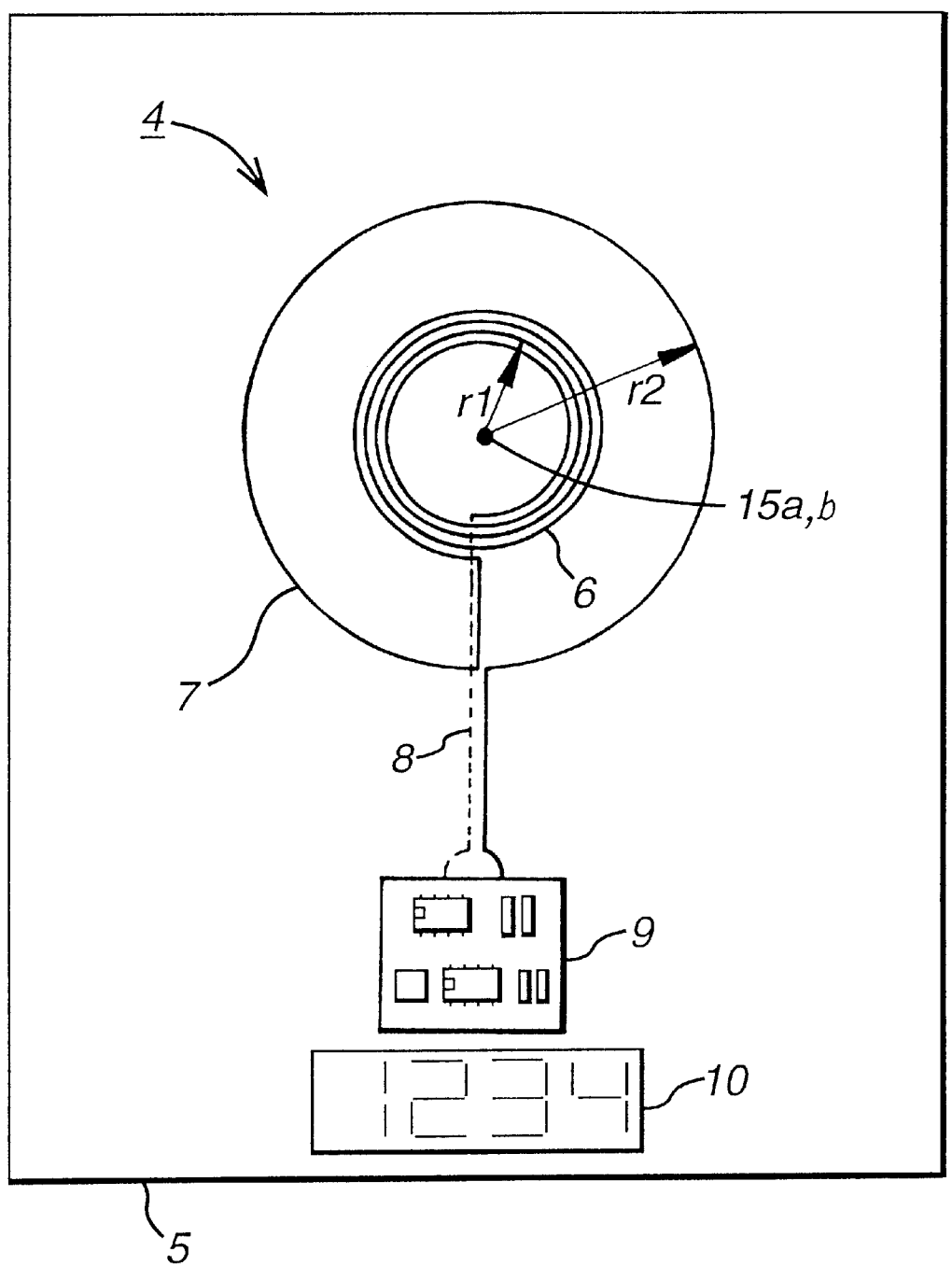
FIG. 2 is a top view of a printed circuit board, which forms part of the current sensor shown in FIG. 1, and illustrates coil arrangements of the current sensor.

FIG. 2 shows the sensor PCB 5 and also illustrates in more detail the relationship between the sense portion 6, and the cancellation portion 7, of the current sensing coil 4. In this embodiment, the sensor PCB 5 is a single-sided PCB and the pattern of copper formed on the sensor PCB 5 is shown in solid lines. The dotted line 8 shown in FIG. 2 shows the position of a wire link which connects the innermost end of the sense portion 6 to the sensor circuitry 9.

As shown in FIG. 2, the sense portion 6 is a spiral coil having four turns, each substantially of radius r1. The cancellation portion 7 is a single turn of radius r2. The effective magnetic dipole position centres of the sense portion 6 and the cancellation portion 7 are substantially co-located and are shown at points 15a, 15b, respectively. The effective magnetic centre of a coil is given by the position and direction of an infinitesimal dipole (of appropriate magnetic field strength) such that, when observed in their far fields, the coil and the dipole are indistinguishable. The radius of the cancellation portion 7 is substantially double that of the sense portion 6. Thus even though the sense portion 6 and the cancellation portion 7 have different numbers of turns and have different sizes, they have substantially the same turns area product.

As shown in FIG. 2, the outer turn of the sense portion 6 is connected to the cancellation portion 7, with the other ends of the sense portion 6 and the cancellation portion 7 being connected to the sensor circuitry 9. As shown, the sense portion 6 and the cancellation portion 7 are connected together so that they are effectively wound in opposite directions. As a result, EMFs induced in the sense portion 6 will oppose the EMFs induced in the cancellation portion 7. Further, since the turns area products of the sense portion 6 and the cancellation portion 7 are substantially the same, the EMF induced in the sense portion 6 in response to a distant (and hence spatially uniform) time-varying magnetic field will cancel out with the EMF induced in the cancellation portion 7 in response to the same distant time-varying magnetic field. Therefore, the current sensor 1 is relatively immune to interference from background magnetic fields.

Figure 3A:
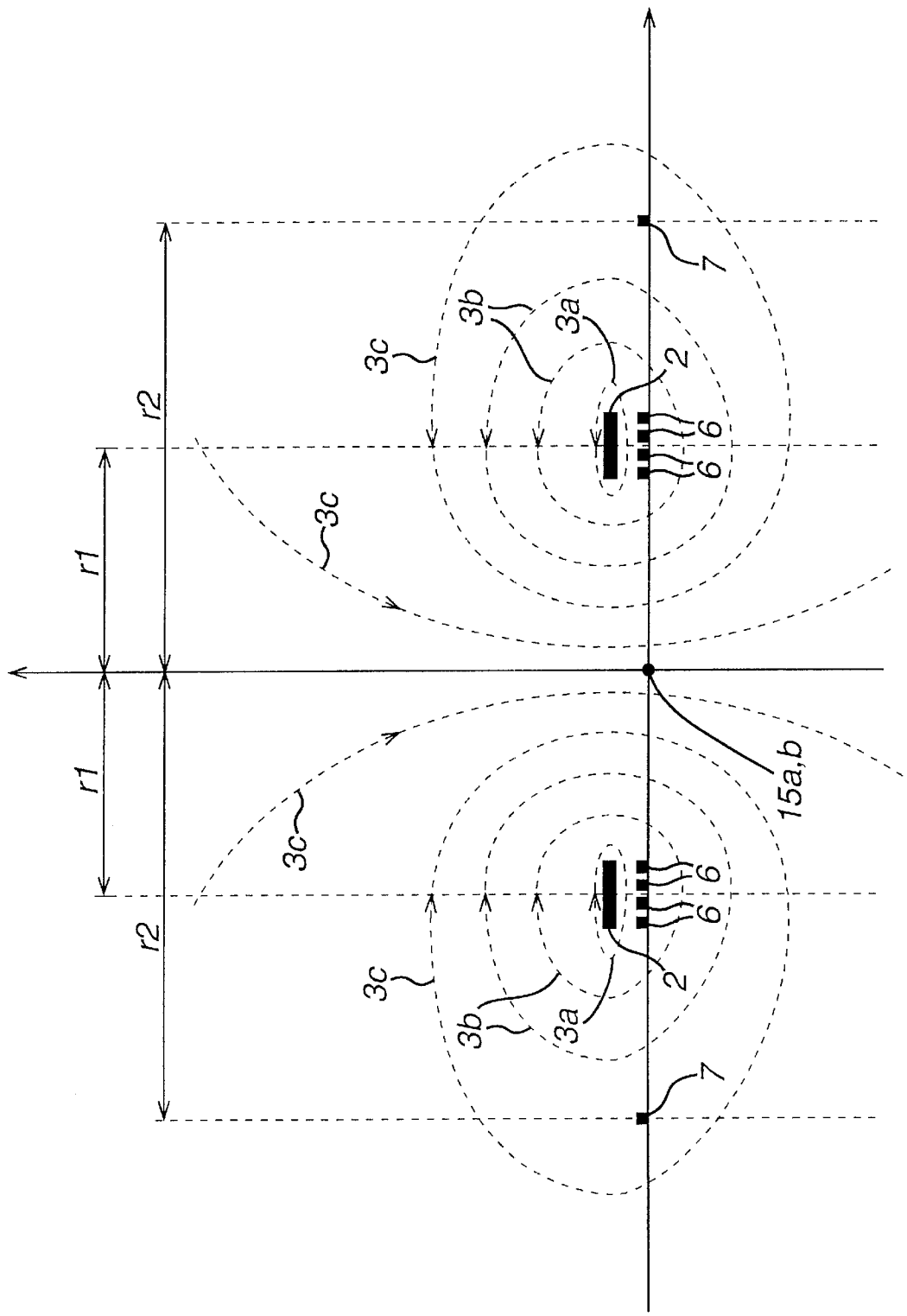
FIG. 3a is a cross-sectional view, through section XX' of FIG. 1, illustrating the magnetic field associated with a current flowing in the load conductors and how that magnetic field interacts with the coil arrangement of FIG. 2.

FIG. 3a shows a cross-section through the sensor PCB 5 along the line X–X' shown in FIG. 1, through a plane that includes the effective magnetic dipole centres 15a, 15b. The cross-section shows the sense portion 6 and the cancellation portion 7 in a substantially common plane and shows the load conductor 2 in a parallel plane, located just above the sense portion 6. FIG. 3a also shows non-linking field lines 3a, sensor-linking field lines 3b and cancellation-linking field lines 3c, all representing the magnetic field established around the load conductor 2 when a current is flowing therethrough. The field lines 3 are illustrated at one instant of time (when the current through the load conductor 2 is at its positive peak).

For clarity, the second load conductor 32 has not been shown in FIG. 3a, but it lies on the opposite side of the sensor PCB 5 to the load conductor 2, with mirror symmetry with regard to the plane of the current sensing coil 4 and the position of the load conductor 2. The second load conductor 32 is connected between the mains inlet 21 and outlet 22 so that the magnetic field produced by the current flowing through it adds to the magnetic field produced by the load current ($I_S$) flowing through the load conductor 2.

The load conductor magnetic field lines 3 form closed loops around the load conductor 2. The non-linking field lines 3a only form closed loops around the load conductor 2 and thus do not induce an EMF in either the sense portion 6 or the cancellation portion 7. The sensor-linking field lines 3b form closed loops around both the load conductor 2 and the sense portion 6, but not around the cancellation portion 7, and therefore these field lines will only couple with the sense portion 6. The cancellation-linking field lines 3c couple the load conductor 2 to both the sense portion 6 and the cancellation portion 7 and therefore have no effect on the sensing coil 4 (since the sense portion 6 and the cancellation portion 7 are wound in the opposite sense). Consequently, since more of the magnetic field 3 established by the current flowing in the load conductor 2 couples with the sense portion 6 than with the cancellation portion 7, a net EMF will be generated in the windings of the current sensing coil 4 which will vary in dependence upon the current flowing through the load conductor 2. This EMF can then be used, as discussed above, to determine the current being used by the load connected to the mains.

Although the previous discussion was in terms of the magnetic field lines 3a, b, c, those skilled in the art will understand that that discussion was a simplified description of the real situation. For example, a full vector field analysis based on finite element modelling may be conducted to calculate the vector magnetic field and EMF induced in the coils.

Field Gradients

As discussed above, one of the important performance aspects of a fiscal electricity meter is its sensitivity to magnetic interference, for example as specified in ANSI C12.16. As will be explained below, by arranging the sense portion 6 and the cancellation portion 7 to have their magnetic centres 15a,15b substantially co-located, the sensing coil 4 is effectively immune to linear field gradients. A linear field gradient is one in which the first derivative with respect to position is constant and the higher derivatives are substantially zero.

FIG. 3b shows the strength of a field gradient at one instant of time as produced by a local, time varying, magnetic source. Here the local source is one that is sufficiently strong, and sufficiently close to the sending coil 4, as to produce a magnetic field with a significant non-uniform constituent. An example of a local source is a conductor that is, say, 0.2 m away from the sensing coil 4 and that carries a heavy current at the same phase and frequency as the current that is to be measured by the fiscal electricity meter 20. In general, such a source will produce a magnetic field with three orthogonal components. Two of these orthogonal components have magnetic field lines in the plane of the sensing coil 4 and cannot, therefore, couple with the sensing coil 4. The other orthogonal component has magnetic field lines perpendicular to the plane of the sensing coil 4 and the magnetic flux associated with this component will therefore couple with the sense portion 6 and the cancellation portion 7. With a linear field gradient, the flux density of the magnetic field lines of this perpendicular component will vary linearly across the sensing coil 4 and is illustrated in FIG. 3b by the line 16.

As shown in FIG. 3b, on the left hand side of the sense portion 6 and the cancellation portion 7, the magnetic field strength 16 is relatively high but reduces linearly across the sensing coil 4 towards the right hand side of the sense portion 6 and the cancellation portion 7. As a result of the variation of the magnetic field strength 16 across the sensing coil 4, the left hand side of the cancellation portion 7 will experience a relatively strong magnetic field and the right hand side of the cancellation portion 7 will experience a relatively weak magnetic field. Similarly, the left hand side of the sense portion 6 will experience a weaker magnetic field than the left hand side of the cancellation portion 7 but the right hand side of the sense portion 6 will experience a stronger magnetic field than the right hand side of the cancellation portion 7. Consequently, because the magnetic centres 15a and 15b of the sense portion 6 and the cancellation portion 7 are substantially co-located, the effects of the magnetic field strength 16 on the sense portion 6 and the cancellation portion 7 will substantially cancel each other out. (If the magnetic field 16 is completely linear then the sense portion 6 and the cancellation portion 7 will completely cancel each other out.)

Processing Electronics

Figure 4:
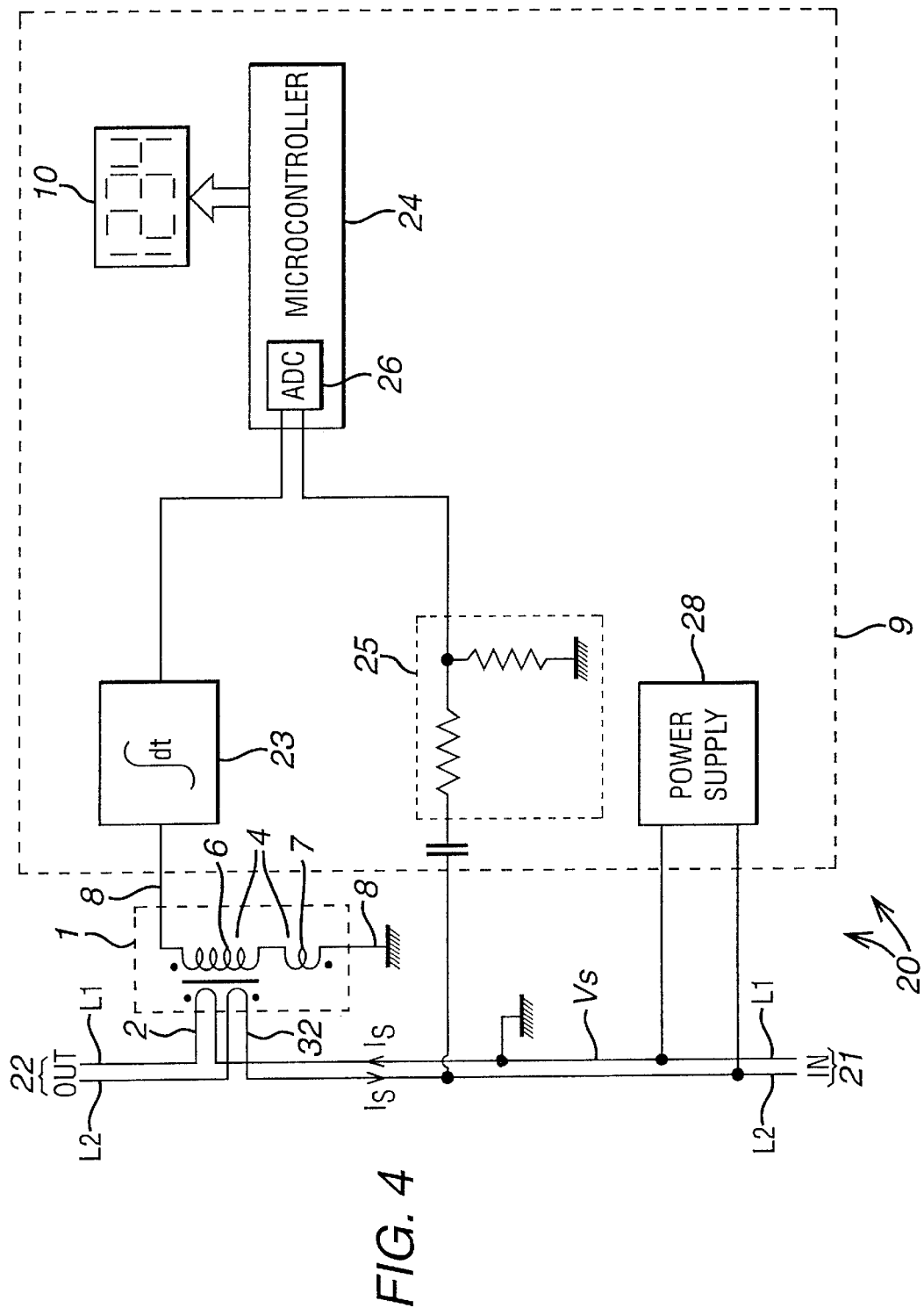
FIG. 4 is a block schematic diagram of the fiscal electricity meter of FIG. 1.

FIG. 4 illustrates a schematic diagram of the fiscal electricity meter 20 and shows the mains input 21 connected via a first live conductor, L1, and a second live conductor, L2, to the mains output 22. A current $I_S$ flows along the live conductor L1 from the mains input 21 to the mains output 22 via the load conductor 2 of the current sensor 1. The current $I_S$ may return along the live conductor L2 from the mains output 22 to the mains input 21 via the second load conductor 32 of the current sensor 1. The load conductor 2 and the second load conductor 32 are arranged so that when the current $I_S$ flows through them they produce magnetic fields which reinforce each other.

The sensor circuitry 9 comprises an integrator 23, a voltage sensor 25, a microcontroller 24 incorporating an analogue digital converter (ADC) 26, and a display 10. The circuitry also includes a power supply 28 which converts the mains supply across L1 and L2 into a DC voltage suitable for powering the rest of the sensor circuitry 9.

The integrator 23 integrates the EMF output from the current sensing coil 4 to produce an output voltage that is proportional to the current flowing in the load conductors 2,32 but independent of the frequency of the current flowing. The integrated value is then digitised by the ADC 26 of the microcontroller 24. As those skilled in the art will appreciate, the integrator 23 compensates for the fact that the EMF output by the current sensing coil 4 is proportional to the rate of change of the current flowing through the load conductors 2, 32 and thus ensures that the signal digitised by the ADC 24 is a true measure of the supply current.

In order to determine the energy supplied to a load via the mains output 22, the fiscal electricity meter 20 needs to know the voltage, $V_S$, as well as the current $I_S$. The voltage $V_S$ (nominally 240 V, as both L1 and L2 are nominally 120V but are 180° out of place with respect to each other) is measured by the voltage sensor 25 which measures the voltage of L2 with respect to L1 and feeds a predetermined portion of the measurement to another channel of the ADC 26 for digitisation. The microcontroller 24 then multiplies the digitised values of the voltage $V_S$, and the current $I_S$, together to determine the instantaneous power, $P_S$, being used by a load connected to the mains output 22. The microcontroller 24 then integrates the instantaneous power $P_S$ with respect to time in order to determine the energy, $E_S$, supplied to the load. The cumulative energy supplied to the load is then displayed upon the display 10.

As has been described, the current sensor 1 allows the construction of a fiscal electricity meter 20 in which the load conductors 2, 32 are galvanically isolated from the current sensor 1 and which is substantially immune to linear magnetic field gradients and to uniform magnetic fields.

Alternative Embodiments

Figure 5A:
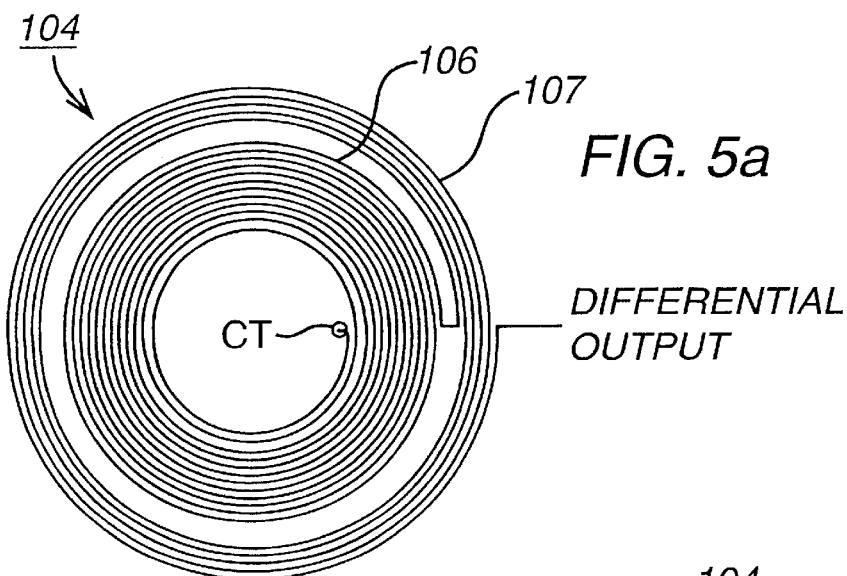
FIG. 5a shows the printed conductors on a top layer of a preferred PCB current sensor embodying the invention.
Figure 5B:
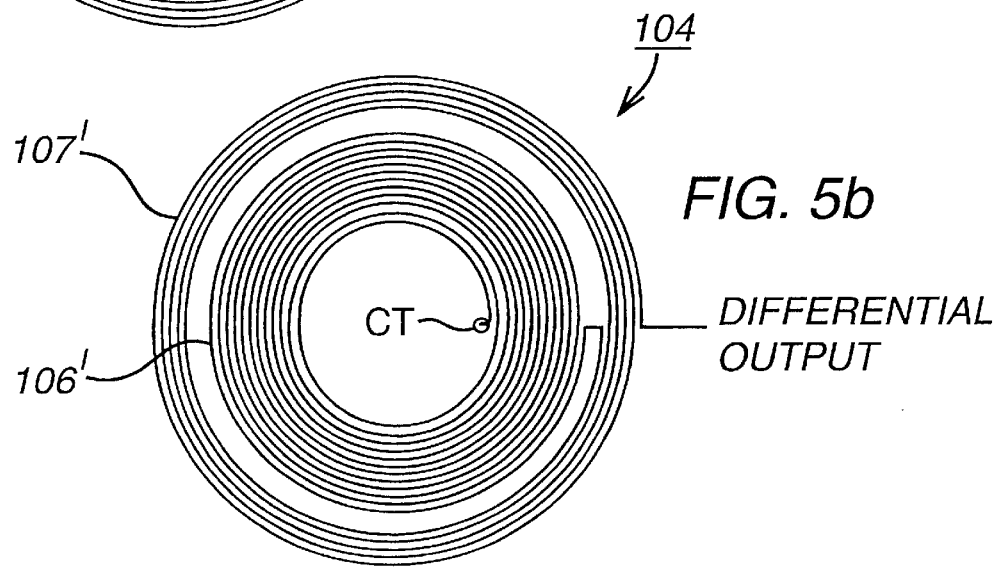
FIG. 5b shows the printed conductors on the bottom layer (viewed from the top layer) of the preferred PCB current sensor.
Figure 6:
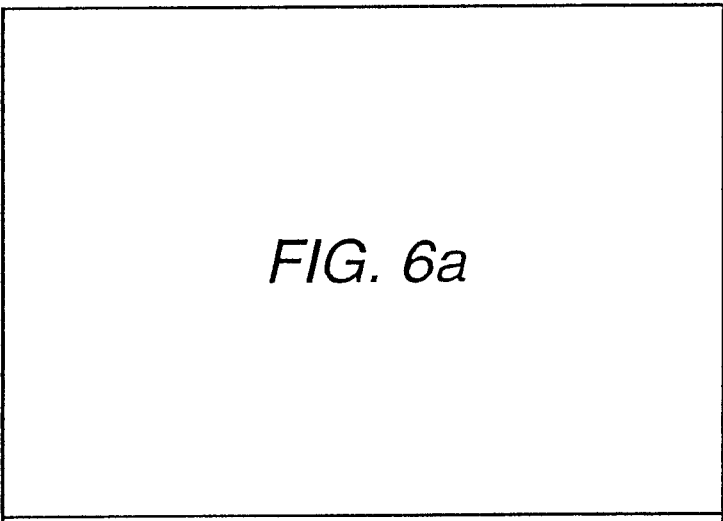
FIG. 6 shows a circuit diagram, for a preferred fiscal electricity meter, suitable for use in conjunction with the current sensor of FIGS. 5a and 5b.
Figure 6:
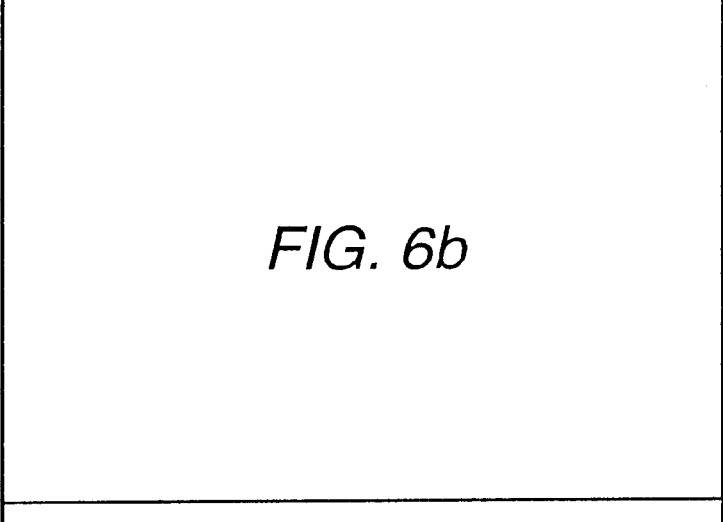
Figure 6:
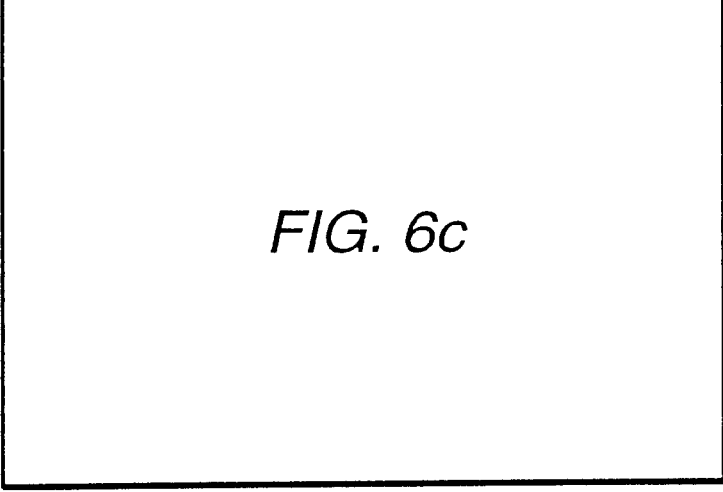

A preferred current sensor 101 will now be described with reference to FIGS. 5 and 6. The current sensor 101 is similar to the current sensor 1 but has a differential sensing coil 104 shown in FIGS. 5a and 5b. The differential sensing coil 104 is formed on the top and bottom layers of a standard 1.6 mm thick PCB. FIG. 5a shows the conductor track on the top layer of the PCB and FIG. 5b shows the conductor track on the bottom layer of the PCB (when viewed from the top of the PCB). As shown in FIG. 5a, the top layer of the differential sensing coil 104 comprises a conductor which is wound from a centre tap (CT) in an increasing clockwise spiral for 12 turns. The conductor is then wound in the opposite direction in an increasing anti-clockwise spiral for 5 turns. The clockwise spiral windings define an inner sense portion 106 and the anti-clockwise spiral windings define an outer cancellation portion 107. Similarly, the bottom layer of the PCB has a conductor which is wound from the centre tap (CT) in an increasing anti-clockwise spiral for 12 turns and then in an increasing clockwise spiral for 5 turns. The increasing anti-clockwise windings define an inner sense portion 106' and the clockwise windings define an outer cancellation portion 107'. In this embodiment, the windings on the top and bottom layers of the PCB are connected together through a via hole located at the centre tap (CT) and the other ends of the windings are connected to the processing electronics (not shown).

For the current sensor 101, the inner sense portions 106 and 106' each have an inner radius of 5 mm and an outer radius of 10 mm and the outer cancellation portions 107 and 107' each have an inner radius of 12 mm and an outer radius of 14 mm. The track width of the sense and cancellation portions is conveniently set to 0.008" (0.20 mm). The current sensing coil 104 is preferably used with load conductors having loop portions (such as those shown in FIG. 1) having an inner radius of approximately 5 mm and an outer radius of approximately 10 mm. The load conductors are preferably stamped from copper sheet having a thickness of 2.5 mm so that they can carry a rated current of 200 A without excessive heating. The load conductors are preferably spaced 0.5 mm from the top and bottom layers of the sensor PCB. With this configuration, the differential current sensing coil 104 is operable to output 20 mV RMS in response to a 200 A RMS 60 Hz load current flowing through the load conductors.

Figure 6A:
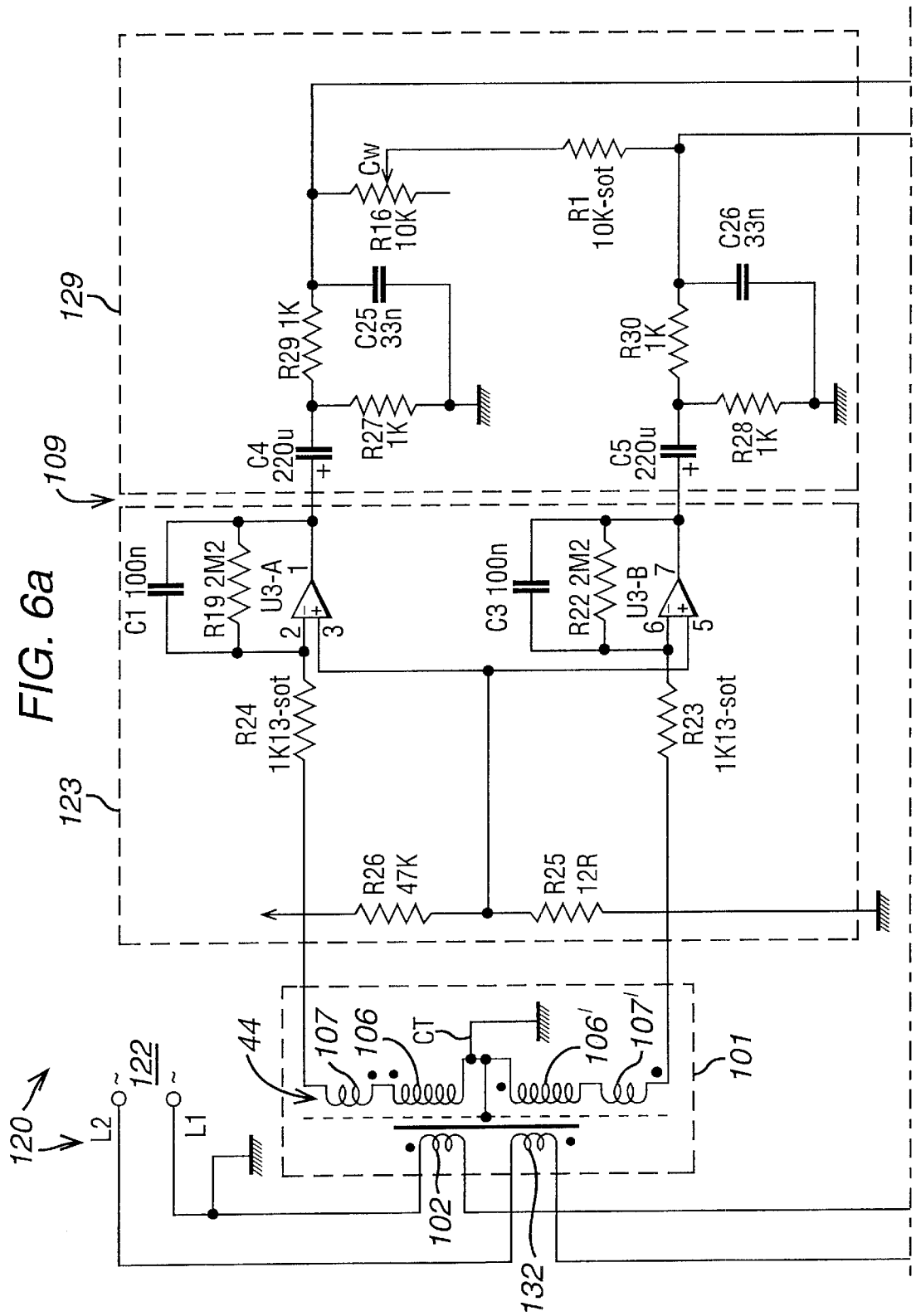
Figure 6B:
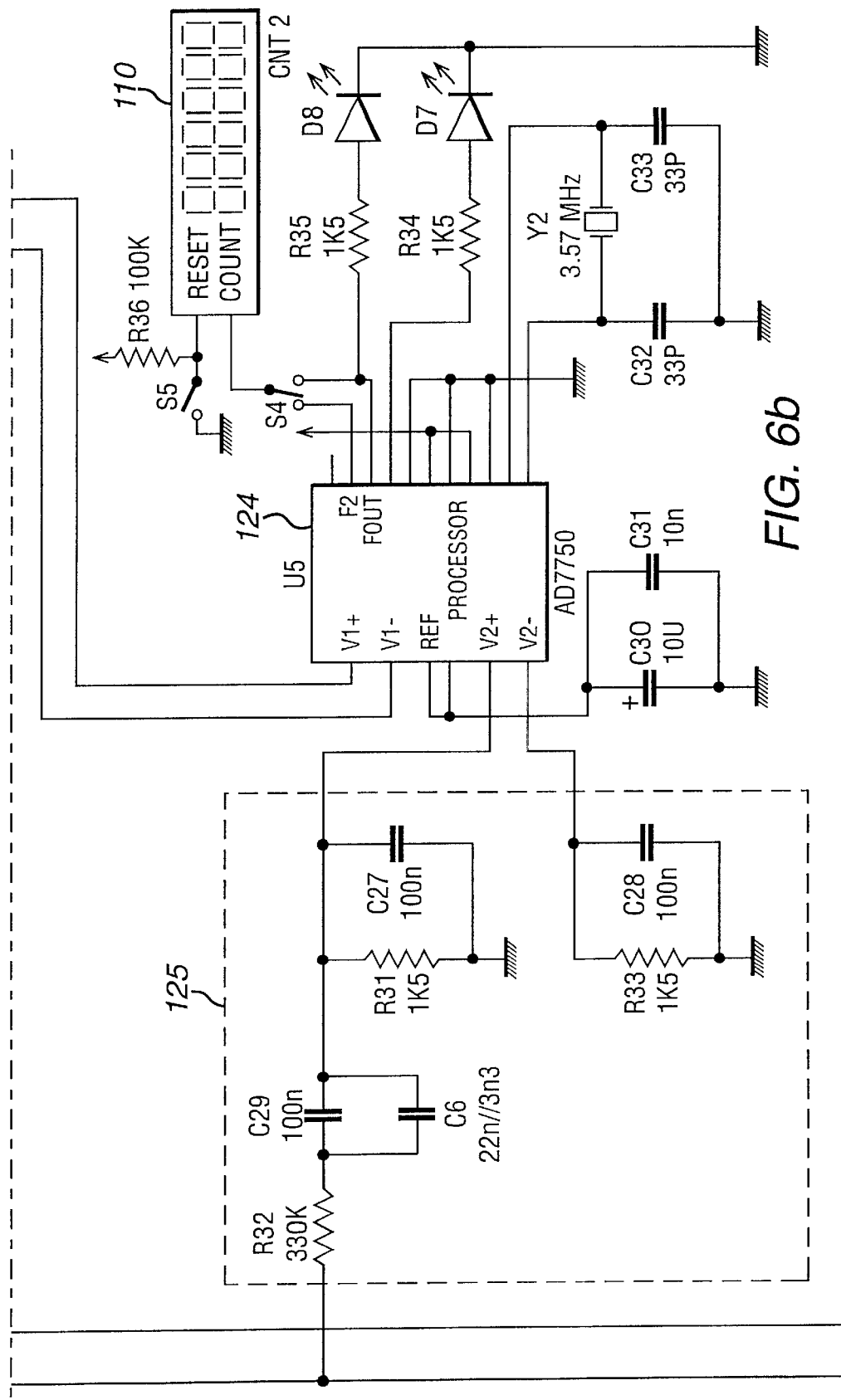
Figure 6C:
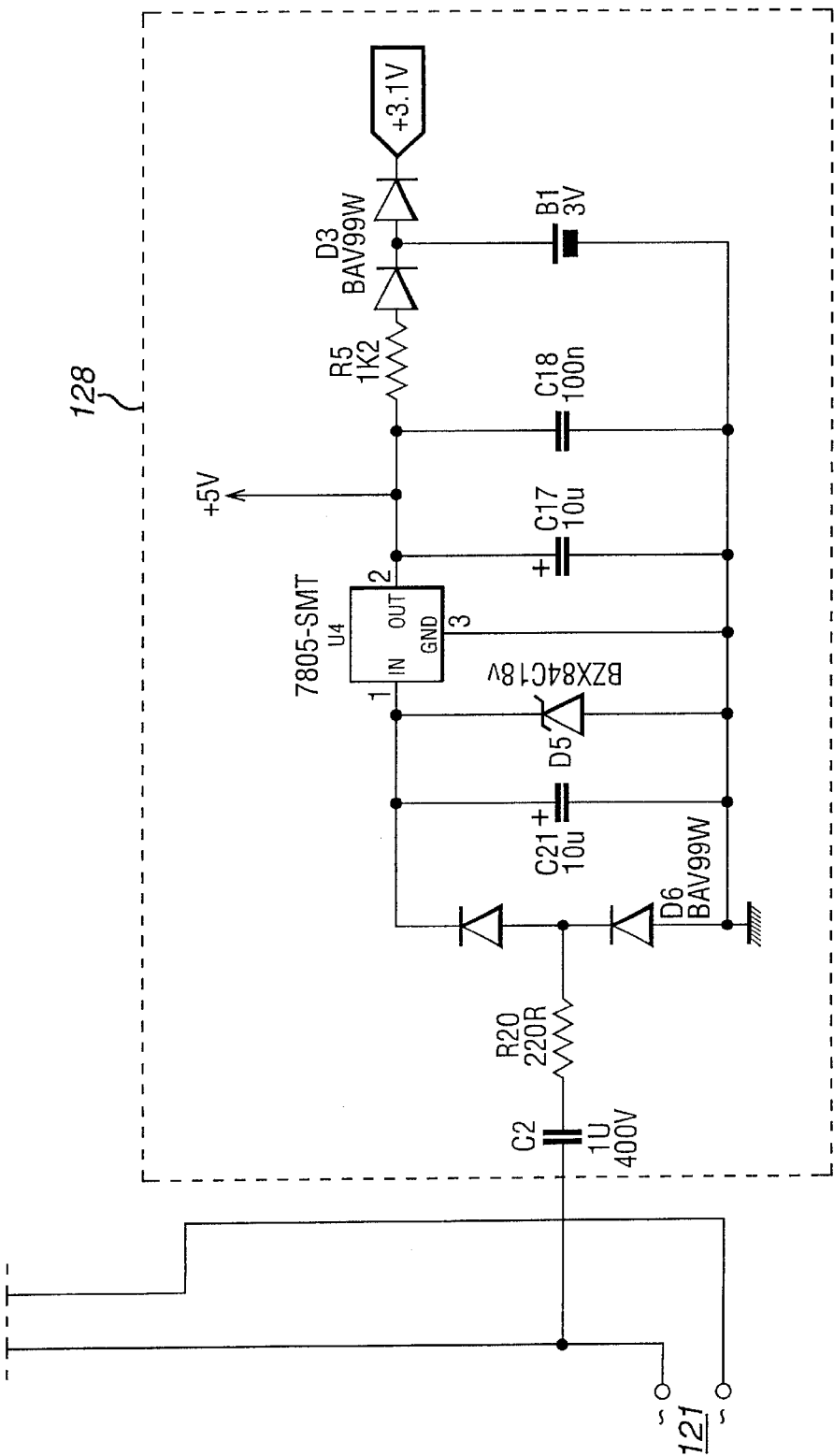

FIGS. 6a, 6b and 6c show a schematic diagram of a preferred fiscal electricity meter 120 which incorporates alternative sensor circuitry 109 suitable for use with the differential current sensor 101. The preferred fiscal electricity meter 120 shown in FIG. 16 is also suitable for use with a 2S 3 wire format US mains supply.

As shown, the fiscal electricity meter 120 comprises a mains input 121 which connects to the two live phases of a 2S 3 wire format 240 v (120 v) centre tapped mains supply. The two live phases are designated L1 and L2, respectively, and are both 120 V RMS 60 Hz, with respect to neutral (not shown), with a phase difference of 180° between them so that 240 V RMS is developed between them. The meter 120 does not connect to the neutral conductor. Live L1 connects from the mains input 121 to the mains output 122 via a load conductor 102. Similarly, live L2 connects from the mains input 121 to the mains output 122 via a load conductor 132. The load conductors 102, 132 are arranged so that currents flowing along the live phases produce magnetic fields which reinforce each other at the current sensor 101.

As shown in FIG. 6a, the current sensor 101 comprises the previously described differential current sensing coil 104, the output of which is integrated by a differential integrator 123. The outputs of the differential integrator 123 then pass through a gain adjusting network 129 which, by virtue of variable resistor R16, adjusts the output of the differential integrator 123. The gain adjusting network 129 also includes anti-aliasing networks R29,C25 and R30,C26 which have a −3 dB cut-off frequency of 5 kHz. These anti-aliasing networks have a small phase shift at 60 Hz of about 0.2°. The outputs from the gain adjusting network 129 are then input to a processor 124 for digitisation and subsequent processing together with a measure of the supply voltage obtained from a voltage sensor 125 (shown in FIG. 6b).

The voltage sensor 125 measures the voltage of live L2 relative to live L1. This measurement allows the fiscal electricity meter 120 to calculate the power being supplied to the load by multiplying together the voltage of the mains supply with the current being supplied to the mains output 122. There are three functional elements to the voltage sensor 125 (some of which share components): a voltage attenuator to reduce the mains supply voltage to a level suitable for digitisation by the processor 124, anti-aliasing networks, and a phase compensation network, which has a phase shift at the mains frequency of 60 Hz of a few degrees. The phase compensation network is principally formed from the interaction of C29,C6 with the remainder of the components of the voltage sensor 125 and serves to equalise the accumulated phase shifts through the voltage sensing portions and the current sensing portions of the fiscal electricity meter 120 (including the small phase shifts introduced by the anti-aliasing networks).

As those skilled in the art will appreciate, the voltage sensor 125 includes phase compensation to allow for the fact that the differential integrator 123 is not a perfect integrator. (The EMF output by the differential coil 104 is proportional to the rate of change of the currents flowing through the load conductors 102, 132 and this EMF therefore has a 90° leading phase shift with respect to the current.) A perfect integrator would have a 90° lagging phase shift with the result that the leading and lagging phase shifts of 90° would cancel out to leave the output voltage of the integrator in phase with the current flowing through the load conductors 102, 132. However, in practice, the differential integrator 123 does not have the perfect phase shift of 90° lagging and therefore the phase cancellation is incomplete, leaving its output voltage with a residual phase shift of up to a few degrees with respect to the current flowing through the load conductors 102, 132. The phase compensation network compensates for this residual phase shift to ensure that the two signals (representing the mains supply voltage and current, respectively, presented to the processor 124 for digitisation are accurately in phase with each other (preferably to better than 0.1°).

This is important because some loads which may be connected to the mains output 122 may have a reactive component in which case the power supplied to the load will have a non-unity power factor (i.e. cos ø≠1). Accurate preservation by the fiscal electricity meter 120 of the phase of the current relative to the phase of the voltage therefore allows the meter 120 to accurately measure the real, as opposed to the apparent, energy supplied to the mains output 122.

In this embodiment, the processor 124 is the AD7750 integrated circuit, manufactured by Analogue Devices. The AD7750 comprises two 20-bit, differential input, A/D converters with a typical analogue input bandwidth of 3.5 kHz, enabling the input signals (representing the current and voltage supplied to the load) to be digitised approximately 180 times per 60 Hz mains cycle. The AD7750 also comprises a digital multiplier and a digital low pass filter which allow the AD7750 to calculate the power used by a load connected to the mains output 122. The AD7750 indicates the power by producing a pulse train and by varying the frequency of this pulse train in proportion to the power being used by the load (thus each pulse indicates a quantum of energy). These pulses are counted by a display 110 so that the number displayed indicates the accumulated energy supplied to the load.

Power for the sensor circuitry 109 is provided by a power supply 128 (shown in FIG. 6c). A capacitor (C2) is used to drop down the mains voltage to a lower value which is then rectified, and regulated, to provide a +5 volt DC supply. The power supply 128 also includes a back-up battery so that the counted value indicated by the display 110 is retained in the event of a mains power cut. in this embodiment, the ground reference for the sensor circuitry 109 is live L1 and so the sensor circuitry 109 "floats" upon the voltage of live L1. The centre tap (CT), the differential integrator 123 and the ADCs within the processor 124 are connected to a filtered and relatively noise-free version of this ground reference.

In this embodiment an electrostatic screen (not shown) is provided between the load conductors 102,132 and the sense/cancellation portions 106,106'/107,107' to reduce capacitive coupling of noise spikes, and the AC mains supply potential, to the differential integrator 123. In order to be effective, the electrostatic screen is connected to the "ground" reference (live L1).

Figure 7:
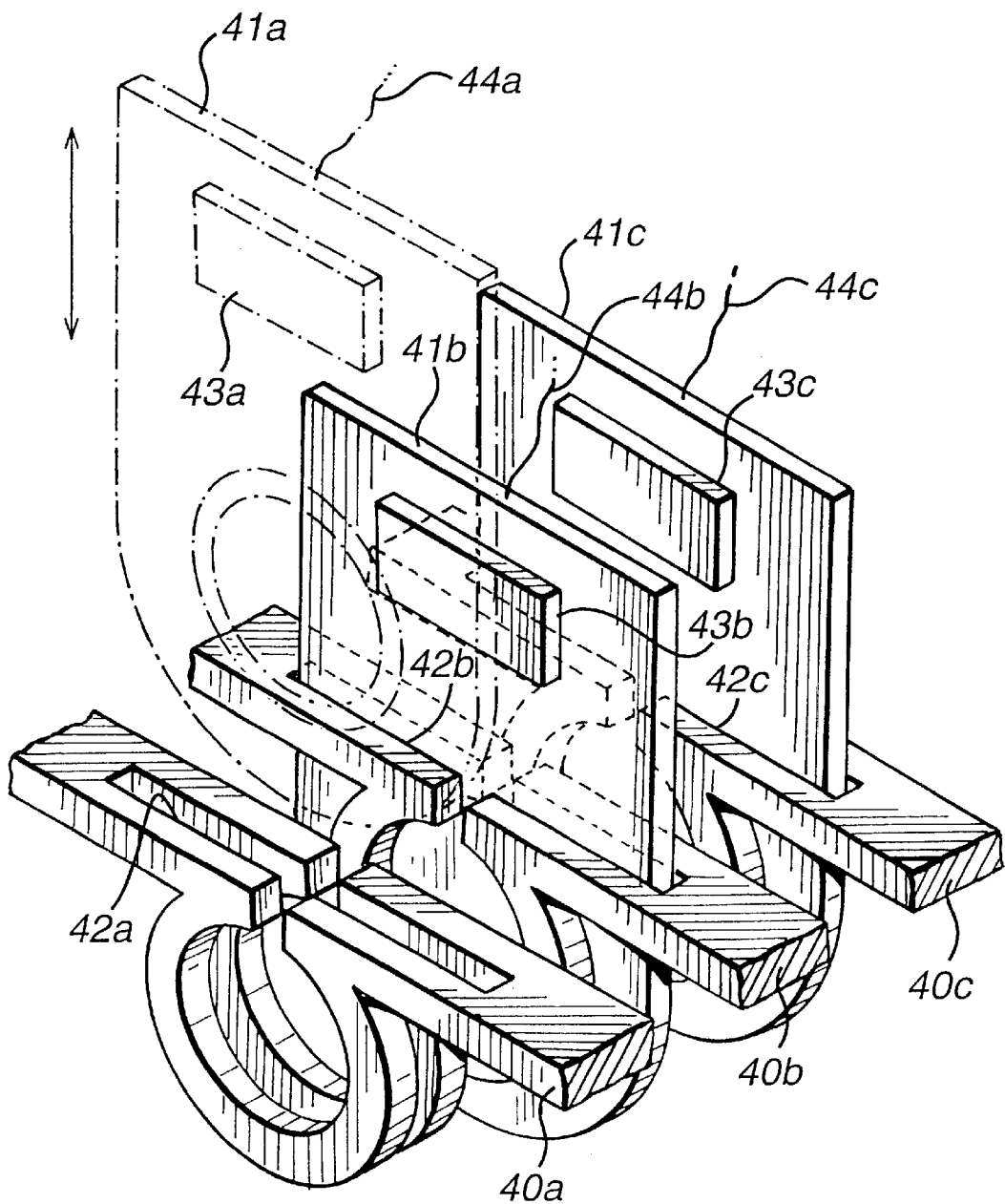
FIG. 7 shows a load conductor arrangement suitable for measuring three phase current and also shows an alternative embodiment of a current sensor system.

In the above embodiments, a single phase current measurement system was described. A three phase current measurement system will now be described with reference to FIG. 7. This system may be used, for example, for checking the current balance between the load conductors of a three phase system, or for measuring the power being used by a three phase system. As shown in FIG. 7, three identical assemblies are illustrated, each denoted by the suffixes a, b, c, respectively, comprising three load conductors 40a, 40b, 40c, current sensors 41a, 41b, 41c, slots 42a, 42b, 42c, signal conditioning circuitry 43a, 43b, 43c and leads 44a, 44b, 44c. Each of the load conductors 40 is a copper busbar provided with a substantially planar loop shaped region. As shown in FIG. 7, a slot 42 is provided in each of these loop-shaped regions in which a respective current sensor 41 is located and held in place relative to their respective load conductor 40 using an appropriate mounting bracket (not shown). As shown, the current sensors 41 are substantially planar and are oriented with respect to their associated load conductor 40 such that the magnetic flux concentrated by the loop shaped regions passes substantially normally through the planes of the current sensors 41.

Each of the current sensors 41 includes respective local signal conditioning circuitry 43 to produce a signal which varies with the signal flowing in the associated load conductor 40. In this embodiment, this signal is output along the respective lead 44 to a monitoring system (not shown).

The load conductors 40 are spaced apart from each other by a distance sufficient to ensure that any magnetic coupling between neighbouring current sensors 41a,b,c is low enough with regard to the degree of accuracy required by the application. Thus the measurement of current produced by each of the current sensors 41 will be substantially independent of the current flowing through the other, adjacent, phase conductors 40.

Figure 8:
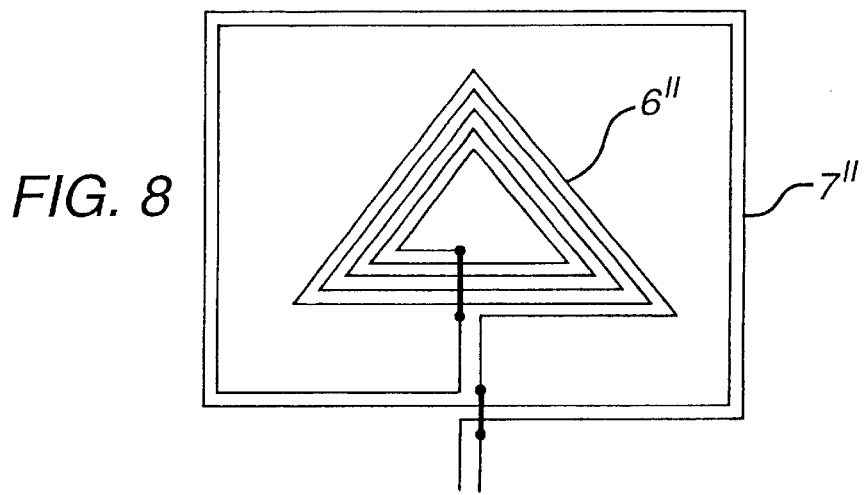
FIG. 8 shows an alternative arrangement of sensor windings which can be used in the current sensor system of FIG. 1.

In the above embodiments, circular current sensing coils were used. As those skilled in the art will appreciate, other geometries of sensing coils may be used which will still provide the advantages of the invention. For example, FIG. 8 shows an alternative current sensing coil comprising a triangular sense portion 6" lying inside a square cancellation portion 7". As with the embodiments described above, the positions and directions of the effective magnetic dipole centres of the triangular sense portion 6" and of the square cancellation portion 7" are substantially co-located, and co-aligned, and their turns area products are substantially equal. Further, although the earlier embodiments of the fiscal electricity meters 20,120 referred to the use of a circular spiral current sensing coils 4,104, in practice, truly spiral coils are relatively difficult to design and manufacture. Thus the preferred type of spiral coil is one which is approximated by semicircular segments of progressively increasing/ decreasing diameter.

Various modifications which can be made to any of the above embodiments will now be described. Although the embodiments described above used a load conductor 2 comprising substantially one turn, other arrangements are possible. For example, the load conductor 2 may comprise a plurality of turns in order to establish an increased magnetic field to increase the sensitivity of the current sensor system 1. Disadvantages of using a coiled load conductor include increased manufacturing cost and excessive self-heating. In another embodiment wire may be used, to form the load conductor 2 instead of a copper busbar. The use of wire allows the wire to be clipped into a holder (not shown) to form the loop shaped region. The holder may be a plastic moulding attached to the sensor PCB 5. Disadvantages of using wire include a non-optimum magnetic field configuration and reduced reproduceability as compared to a pre-formed load conductor.

In a further embodiment a ferrous clamping bolt may be used to clamp the sensor PCB to the load conductor. This ferrous clamping bolt can then act as a magnetic component to concentrate the load conductor magnetic field lines 3 so as to increase the flux linkage between the load conductor 2 and the sensor portion 6. However, a potential disadvantage of using a ferrous clamping bolt is that the AC load current $I_S$ flowing through the load conductor 2 will induce eddy currents in the clamping bolt which may cause excessive heating thereof. If the load conductor 2 is insulated or if isolation is not required then a non-insulated clamping bolt may be used. Alternatively, in a further embodiment, ferrite core pieces may be used to form a closed magnetic circuit around the load conductor 2, the sense portion 6 and the cancellation portion 7, in order to further increase the magnetic coupling between the load conductor 2 and the sense portion 6.

In the above embodiments, the current sensors 1,41,101 have all been described in terms of PCBs with conductor patterns formed to produce sense portions and cancellation portions. Whilst PCBs will typically allow the current sensors to be produced at a relatively low cost with good reproducibility, other embodiments are also envisaged. For example, wire could be suitably coiled to produce the sense and cancellation portions. Alternatively, the required pattern of the sense and cancellation portions (and, optionally, the load conductor too) could be screen printed (using conductive ink) onto a ceramic substrate as part of a hybrid unit.

In FIG. 2, the sense portion 6 and the cancellation portion 7 are both located on the same layer of the sensor PCB. This ensures that their effective centres of magnetic dipole moments are substantially co-located. However, non co-planar coil arrangements may also be used whilst maintaining the advantages of the first embodiment provided that the effective magnetic dipole centres of the sense portion and the cancellation portion are substantially co-located. For example, in an alternative embodiment a 3 layer PCB could be used in which the cancellation portion is formed on the middle layer and the sense portion is formed as complete turns on both the lower layer and the upper layer. In such an embodiment, the allocation of the turns of the sense portion between the top and bottom layers of the PCB, and the diameter of these turns, would be determined by taking into account the separation between the middle and top layers and the separation between the middle and bottom layers, so that the combination of the top and bottom layers yields a sense portion 6 with an effective centre of magnetic dipole co-located with that of the cancellation portion, in the middle layer.

More generally, to achieve the advantages of the first embodiment, the magnetic dipoles of the sense portion and the cancellation portion should be substantially co-located and directed along the same axis. Thus although in the coil arrangements so far presented the sense and cancellation portions have not overlapped, an overlapping arrangement is possible. One example of an overlapping coil arrangement would comprise a smaller rectangular coil of many turns and a larger rectangular coil having a single turn with the same turns area product as the smaller coil. The smaller and larger coils would be arranged so that their longitudinal axes are substantially orthogonal and dimensioned so that the smaller coil is longer than the larger coil is broad, and so that the larger coil is longer than the smaller coil is broad. In such an embodiment, the load conductor would run parallel to, and just outside, one of the longer sides of the smaller rectangular coil. As a further variation of such an embodiment, two planar rectangular coils, each having 1 turn and of the same size, could be arranged orthogonally in a common plane. The load conductor would couple to both coils, but would couple most strongly to the coil along whose longer side the load conductor ran in proximity to.

Although, so far, embodiments have been described in which the sense and cancellation portions are substantially co-located, and are substantially co-directional, in an alternative embodiment the sense and cancellation portions could be substantially separated whilst keeping the axes of the magnetic dipoles of the sense portion and the cancellation portion substantially coaxial. However, due to the separation between the planes of the sense portion and the cancellation portion, such an additional embodiment will be sensitive to magnetic field gradients along the coaxial axis of the portions. Although, such an embodiment would remain insensitive to magnetic field gradients that are substantially orthogonal to the coaxial axis (as was explained earlier in terms of the "left hand side" and "right hand side" of the sense portion and cancellation portion).

In the above embodiments, the sense portion and the cancellation portion were connected in series on the PCB. As those skilled in the art will appreciate, the same result can be achieved by effectively connecting these portions together in the processing circuitry. In such an embodiment, the EMFs produced by the sense portion and the cancellation portion could be separately amplified, integrated and digitised, prior to being combined by the processor, to yield a signal that is substantially immune to extraneous magnetic fields. Further, with such an embodiment, the sense portion and the cancellation portion may have different turns area products since the EMFs induced in the sense portion and the cancellation portion can be amplified by different amounts. Thus, for example, if the sense portion has a turns area product that is one third that of the cancellation portion, then the gain of the sense portion's amplifier would be set to be three times that of the cancellation portion's amplifier.

In the above embodiments, the load conductor was dimensioned so as to couple to the inner turns (sense portion) more strongly than to the outer turns (cancellation portion). In an alternative embodiment, the load conductor may be dimensioned so as to couple more strongly to the outer turns than to the inner turns. However retaining the sense portion 6 on the inside allows the size of the current sensor 1 to be minimised, which is beneficial since reducing the linear dimensions of the current sensor 1 by a factor of two reduces its sensitivity to non-uniform magnetic fields by a factor of approximately ten. However, a factor limiting the extent to which the current sensors 1, 101 may be miniaturised is power dissipation in the load conductors 2, 32. In particular, the load conductors 2, 32 must be dimensioned so as to have a suitably low resistance and so as to provide for the effective conduction of heat away from the loop shaped regions thereof.

While the current sensors 1,101 have so far been described as having their sense portions 6,106 and cancellation portions 7,107 co-planar and with their effective magnetic dipole centres co-located and coaxial, in practice some deviation may be tolerated. The degree of deviation that may be tolerated will depend on the application: increasing the deviation reduces the ability of the current sensor to reject unwanted magnetic fields. For example, non co-planarity of the sense and cancellation portions will result in the current sensor having sensitivity to magnetic field gradients that are orthogonal to the planes of the sense and cancellation portions. Similarly, asymmetry between the sense and cancellation portions or between their respective amplifiers will result in a current sensor that has some sensitivity to both uniform magnetic fields and to fields having a field gradient. Further, if the directions of the effective magnetic dipoles of the sense and cancellation portions are not substantially co-directional, then the current sensor will become sensitive to both uniform fields and gradients.

In the second embodiment, the sense portions 106,106' are shown wound in the opposite direction to their respective cancellation portions 107,107'. In an alternative embodiment, the sense portions could be wound in the same direction as their respective cancellation portions but connected with the opposite polarity to that of their respective cancellation portions. However, an advantage of winding the sense portions 106,106' in the opposite direction to their respective cancellation portions 107,107' is that the interconnections between the sense portions 106,106' and their respective cancellation portions 107,107' may conveniently be made by connecting the outer turn of the sense portions 106,106' directly to the inner turn of their respective cancellation portions 107,107', obviating the need for vias or wire links (which would otherwise be needed to span the coil windings and to make the interconnections).

In a further modification of the differential current sensing coil 104 the centre tap CT (which is connected to ground) could be dispensed with, so that a single-ended output would be produced, like that of the current sensing coil of the first embodiment. As those skilled in the art will appreciate, such a tapless coil consists, in effect, of two coils in series (one on the top layer of the sensor PCB 105 and the other on the bottom layer) and so will produce double the EMF of an otherwise equivalent single-layered current sensing coil. Since each layer is substantially insensitive to magnetic field gradients, a plurality of such layers may be stacked together to form a solenoidal, as opposed to a planar, current sensing coil. In such an embodiment, care should be taken to ensure that interconnections, both between the layers and from the solenoid ends to the sensor circuitry, do not themselves present a significant loop area to magnetic flux as to produce extraneous EMFs. Alternately, a solenoidal current sensor may be formed by placing one elongate helicoidal coil inside another, instead of by stacking layers together.

In the above embodiments, the signal output from the sensing coil was integrated by an analogue integrator. In an alternative embodiment, this integration may be done numerically by the microcontroller. Alternatively still, integration of the signal from the current sending coil may be omitted. However, without such integration, the signal from the current sensing coil 4 will be proportional to both the current supplied $I_S$ and to the frequency of the mains input 21 (typically 60 Hz, and multiples thereof for any harmonics). In most situations, an appreciable portion of the power is harmonic—i.e. at multiples of the mains frequency. Therefore, since the output of the current sensing coil 4 is proportional to the rate of change of flux, the harmonic currents will be measured with disproportionately large readings. This effect could be compensated for by taking a fast fourier transform (FFT) of the measured current, and by reducing the amplitude of any harmonics in proportion to their multiple of the fundamental. Therefore, in order to avoid these processing difficulties, the integration of the signals obtained by the current sensor is preferred. Integration also allows a DC current through the load conductor 2 to be measured by integrating any changes of the DC current.

Even if no integration of the current signal is performed, a phase shift of 90° will still, in general, be required in the current path (to compensate for the 90° leading phase shift introduced by the current sensor 1,101) to bring the voltage and current signals in phase, so that the real power being used by a load is measured. Alternatively, to measure the reactive power being used by a load, the voltage and current signals would be used in quadrature (i.e. by leaving the current signal +90° with respect to the voltage signal). Knowledge of both the real and imaginary powers being used by a load allows the determination of the load's power factor.

In another embodiment, the fiscal electricity meter 20 may dispense with the voltage sensor 25. The voltage sensor 25 was used to measure the actual, as opposed to the nominal, voltage of the mains input 21. In situations where the voltage of the mains input 21 is sufficiently stable, or where reduced accuracy is acceptable, a nominal value may be used for calculating the power supplied to the load. The use of a nominal voltage measure also has the effect that only a single ADC digitisation channel is required.

Various modifications may be made to the embodiment of the fiscal electricity meter 120 so far described. For example, additional circuitry may be added to the differential integrator 123 to filter out non-line (i.e. non-60 Hz) frequency components. A further modification is the use of the AD7756 Active Metering IC, manufactured by Analogue Devices, instead of the AD7750 as was previously described. The AD7756 is a more sophisticated device with a serial interface which facilitates the provision of an automated calibration interface. Also included are on-chip registers for calibrating the energy measurement, thus obviating the use of select-on-test or trimmer components, as well as a register for phase compensation. Phase compensation allows the phases of the signals from the integrator 123 and the voltage sensor 125 to be balanced digitally, thus either obviating or simplifying the phase compensation network of the voltage sensor 125. In a further embodiment, the display may display current, voltage, power or time either in addition to or instead of accumulated energy. Various alternatives to the embodiment illustrated in FIG. 7 are possible. For example, if it is known that the currents in the three load conductors 40 are balanced then a measurement need only be performed for two of the load conductors 40, with the current for the third phase conductor 40 being inferred from the other two measurements. Furthermore, although the current sensors 41 may be formed from a conventional PCB, for high voltage applications it may be preferable if at least a portion of each of the three current sensor assemblies 41 is formed from a high grade insulator such as alumina. Such a construction may assist with approval from regulatory bodies such as UL, CSA and VDE. Further, although it is preferable that each current sensor assembly 41 has its own signal conditioning circuitry 43, it is possible to use an arrangement in which the leads 44 convey the EMFs produced by the respective sense and cancellation portions to remote signal conditioning circuitry. Such an arrangement has the disadvantage that any flux captured by any cross-sectional area within the leads 44 will result in an error EMF being superimposed on the desired signal.

FIG. 7 shows each current sensor 41 mounted within a respective slot 42 within the respective load conductor 40. As an alternative, the current sensors 41 may be mounted on one side face of the loop shaped region of their associated load conductors 40 instead of in a slot 42. For higher accuracy applications, each load conductor 40 may be provided with two current sensors 41, one mounted on each of the two side faces of the loop shaped region. The signals from the two current sensors 41 may then be combined, for example by averaging them together, and processed to yield a more accurate measurement of the current flowing through the load conductor 40.

In another embodiment, a single current sensor may be used to simultaneously measure the currents flowing through two load conductors. This embodiment may be conveniently implemented by mounting a load conductor to one side of the current sensor and another load conductor to the other side of the current sensor. The current sensor would then measure the superposition of the magnetic fields produced by the two phase conductors.

In the above embodiments, the fiscal electricity meters 20,120 have been directly connected to one of the live conductors of the mains supply to provide a ground reference. In a modified embodiment, the meter circuitry may be at, for example, earth potential. Such a meter would be fully isolated from the mains and could obtain electrical power, and a measurement of the mains voltage by capacitive coupling to the mains.

Although the current sensors 1,41,101 have been illustrated in fiscal electricity meters 20,120 they are also suitable for other applications including inrush current sensing/regulation for electric motors and current sensing for power factor correction and the like. Alternatively, the current sensors could be used to indicate the power (as opposed to the accumulated energy) being used by a load.

Examples of fiscal electricity meters have been described above, that use current sensors 1, 41, 101 which are substantially insensitive to magnetic field gradients. In other embodiments, more conventional current sensors are formed on a PCB for use as part of a fiscal electricity meter. In one example of a more conventional current sensor, two spiral coils, one clockwise and the other anti-clockwise, are formed on the tracking layer of a single-sided PCB. The two coils are symmetrical except that a load conductor is arranged to pass through the centre of the clockwise spiral (via a suitably dimensional hole through the PCB). A wire link on the component side of the PCB is used to interconnect the innermost turn of both coils. Although this example of a more conventional current sensor has the disadvantage that it is sensitive to magnetic field gradients, it does have the advantage that it is formed on a PCB; this allows for easy integration with signal processing electronics, especially if the signal processing electronics are formed on the same PCB as the sensor.

What is claimed is:

1. A transducer for use in a current sensor, the transducer comprising:
   a first sense coil having an axis about which one or more turns of conductor are formed and having an effective magnetic centre which lies on the axis and which is defined by the configuration of the turns; and
   a second sense coil having an axis about which one or more turns of conductor are formed and having an effective magnetic centre which lies on the axis and which is defined by the configuration of the turns;
   wherein the first and second sense coils are arranged so that they are substantially co-located.

2. A transducer according to claim 1, wherein the first and second sense coils lie in planes that are substantially parallel.

3. A transducer according to claim 1, wherein the first and second sense coils are located in a substantially common plane.

4. A transducer according to claim 1, wherein the first sense coil has a different area to that of the second sense coil.

5. A transducer according to claim 4, wherein each turn of the second sense coil encloses each turn of the first sense coil.

6. A transducer according to claim 1, wherein the first sense coil has a turns area product which is substantially equal to that of the second sense coil.

7. A transducer according to claim 1, wherein the first sense coil comprises a plurality of turns.

8. A transducer according to claim 7, wherein the turns of said first sense coil are located substantially in a common plane.

9. A transducer according to claim 1, wherein the second sense coil comprises a plurality of turns.

10. A transducer according to claim 9, wherein the turns of said second sense coil are located substantially in a common plane.

11. A transducer according to claim 1, wherein said first and second coils have substantially equal turns area products.

12. A transducer according to claim 1 wherein the first and second sense coils are formed on a common PCB.

13. A transducer according to claim 1, wherein the first and second sense coils are connected in series and arranged so that a signal induced in the first sense coil and the second sense coil by a common electromagnetic field oppose each other.

14. A transducer according to claim 1, further comprising processing means for processing signals induced in the first and second sense coils.

15. A transducer according to claim 14, wherein the processing means comprises means for subtracting a signal output from the second sense coil from a signal output from the first sense coil.

16. A transducer according to claim 14, wherein said processing means comprises an integrator for integrating the signals from the first and second sense coils.

17. A transducer according to claim 14, wherein said processing means and the first and second coils are mounted on a common circuit board.

18. A current sensor comprising a transducer according to claim 1.

19. A method of sensing current characterised by the step of using the transducer or the current sensor of claim 1.

20. A transducer for use in a current sensor, the transducer comprising:
    a first sense coil having an axis about which one or more turns of conductor are formed and having an effective magnetic centre which lies on the axis and which is defined by the configuration of the turns; and
    a second sense coil having an axis about which one or more turns of conductor are formed and having an effective magnetic centre which lies on the axis and which is defined by the configuration of the turns;
    wherein the first and second sense coils are arranged so that their effective magnetic centres are substantially co-axial.

21. A current sensor comprising:
    an inlet for receiving current from an electricity supply;
    an outlet for outputting the current to a load;
    a conductor connected between the inlet and the outlet for providing a current path through the current sensor for the current; and
    a transducer according to claim 1, mounted adjacent said conductor so that the conductor magnetically couples to the first sense coil more strongly than to the second sense coil, to provide a measure of the current.

22. A current sensor according to claim 21, wherein the conductor has a loop portion located in proximity to the first sense coil.

23. A current sensor according to claim 22, wherein:
    the loop portion of the conductor lies substantially in a plane;
    the primary conductor comprises a slot which extends over a plane substantially parallel to the plane of the loop portion; and
    the transducer is located in said slot so that the axes of the sense coils are substantially orthogonal to the plane of the loop portion.

24. A current sensor according to claim 21, wherein the conductor comprises a coil with one or more turns.

25. A current sensor according to claim 21, wherein the conductor is detachably mountable to the current sensor.

26. A current sensor according to claim 21, further comprising a ferrite component for providing a closed magnetic path around the conductor, the first sense coil and the second sense coil.

27. A current sensor according to claim 21, further comprising:
 at least one further inlet for receiving a further current from a further electricity supply;
 at least one further outlet for outputting the at least one further current to at least one further load;
 at least one further conductor provided between the at least one further inlet and the at least one further outlet for providing at least one further current path through the current sensor for the at least one further current, wherein the at least one further conductor is arranged to magnetically couple to the first sense coil more strongly than to the second sense coil to provide a measure of the at least one further current.

28. A current sensor according to claim 27, wherein said at least one further conductor comprises a loop portion located in proximity to the first sense coil.

29. A current sensor according to claim 28 comprising one further conductor for providing a return path for current flowing between the inlet and outlet.

30. An electricity meter comprising a current sensor according to claim 21, further comprising:
 means for providing a measure of the voltage of the electricity supply; and
 means for determining and outputting an indication of an electrical characteristic of the load in dependence upon the current measure and the voltage measure.

31. An electricity meter according to claim 31, wherein the providing means is operable to measure the instantaneous voltage of the electricity supply.

32. An electricity meter according to claim 30, wherein the determining means is operable to determine the power being used by the load by multiplying the current measure with the voltage measure.

33. An electricity meter according to claim 30, wherein the determining means is operable to determine the energy consumed by the load by integrating, with respect to time, the power used by the load.

34. An electricity meter according to claim 30, wherein the determining means comprises a phase shift network for altering, by a predetermined amount, the relative phase between the current measure and the voltage measure.

35. An electricity meter according to claim 30, wherein the determining means is operable to output an indication of the cumulative energy consumed by the load.

36. An electricity meter according to claim 35, wherein the determining means is operable to output said cumulative energy consumed by the load on a display.

37. A method of sensing current characterised by the step of using the current sensor of claim 21.

38. A transducer for sensing the magnetic field associated with a current flowing in a conductor in an electricity meter, the transducer comprising:
 a first sense coil having one or more turns of conductor which define an effective magnetic centre of the coil; and
 a second sense coil having one or more turns of conductor which define an effective magnetic centre of the second sensing coil;
 wherein the first and second sense coils are arranged so that their effective magnetic centres are substantially co-located.

39. A method of sensing current characterised by the step of using the transducer of claim 38.

40. A current sensor component for sensing and for outputting a measure of a current flowing in a conductor, the current sensor component comprising:
 a first sense coil having an axis about which one or more turns are formed; and
 a second sense coil having an axis about which one or more turns is formed;
 wherein the first and second sense coils are arranged so that their axes are substantially co-linear.

41. A method of sensing current characterised by the step of using the current sensor component of claim 40.

42. A current sensor for sensing and for outputting a measure of a current flowing in a conductor, the current sensor comprising:
 a first sensing coil having a plurality of turns of conductor located in a substantially common plane and having a magnetic centre defined by the configuration of the turns of conductor;
 a second sensing coil having at least one conductive turn located substantially in the same plane as the conductive turns of the first sensing coil and having a magnetic centre defined by the configuration of the at least one conductive turn;
 wherein the first and second sensing coil portions (i) have substantially equal turns area products, (ii) are arranged so that their effective magnetic centres are substantially co-located; and (iii) are arranged to be magnetically coupled to said conductor with different magnetic coupling coefficients; and
 means for subtracting an EMF induced in the outer sensing coil from an EMF induced in the inner sensing coil to provide said measure.

43. A current sensor according to claim 42, wherein the turns of said first sensing coil are smaller than those of the second sensing coil and lie within the turns of the second sensing coil so that their turns do not overlap.

44. A method of sensing current characterised by the step of using the current sensor of claim 42.

45. An electricity meter comprising:
 an inlet for receiving supply current from an electricity supply;
 an outlet for outputting the supply current to a load;
 a primary conductor connected between the inlet and the outlet for providing a current path for the supply current through the meter;
 a current sensor for sensing and for outputting a measure of the supply current flowing through the primary conductor;
 means for providing a measure of the voltage of the electricity supply; and
 means for determining and outputting an indication of energy consumed by the load in dependence upon the current measure and the voltage measure;
 characterised in that said current sensor comprises a sensing coil having:
 (a) an inner sensing coil portion having a plurality of conductive turns located in substantially the same plane and having a magnetic centre defined by the configuration of the conductive turns; and
 (b) an outer sensing coil portion having at least one conductive turn located substantially in the same plane as the conductive turns of the inner sensing coil portion and having a magnetic centre defined by the configuration of the at least one conductive turn;
 wherein the inner and outer sensing coil portions have substantially equal turns area products, are connected in series and are arranged so that (i) EMFs induced in the inner and outer sensing coil portions by a common background alternating magnetic field oppose each other; and so that (ii) their effective magnetic centres are substantially co-located;

wherein said primary conductor has a loop portion which is located adjacent one of said inner and outer sensing coil portions and which lies in a plane substantially parallel to the plane in which the sensing coil portions lie; and wherein the arrangement of the primary conductor and said sensing coil is such that in response to a current flowing in the primary conductor, a signal is induced in said sensing coil which varies in dependence upon the current flowing in the primary conductor.

46. An electricity meter according to claim 45, wherein said loop portion of said primary conductor defines a magnetic centre of the primary conductor, and wherein the arrangement of the primary conductor and said sensing coil is such that the line connecting the magnetic centre of said primary conductor to the magnetic centre of said sensing coil is substantially normal to the plane of said primary conductor.

47. An electricity meter comprising:

an inlet for receiving supply current from an electricity supply;

an outlet for outputting the supply current to a load;

a primary conductor connected between the inlet and the outlet for providing a current path for the supply current through the meter;

a current sensor for sensing and for outputting a measure of the supply current flowing through the primary conductor;

means for providing a measure of the voltage of the electricity supply; and means for determining and outputting an indication of energy consumed by the load in dependence upon the current measure and the voltage measure;

characterised in that said current sensor comprises:

a first sensing coil having a plurality of conductive turns which define an effective magnetic centre of the first coil;

a second sensing coil having at least one conductive turn which defines an effective magnetic centre of the second sensing coil; and wherein the first and second sensing coils are arranged to have substantially the same turns area product and arranged so that their effective magnetic centres are substantially co-located.

48. A current sensor comprising:

a magnetic field generator for receiving a current to be sensed and for generating in response thereto a corresponding local magnetic field; and a sensor configured for sensing the local magnetic field generated by said magnetic field generator and for outputting an output signal that is indicative of the current to be sensed, the sensor comprising (a) a sensor winding having one or more turns of conductor which define an effective magnetic centre of the sensor winding, for sensing magnetic fields and for generating a sensed signal which varies with the sensed magnetic field, and (b) a compensation winding having one or more turns of conductor which define an effective magnetic centre of the compensation winding, for sensing magnetic fields and for generating a compensation signal which varies with the sensed magnetic field; and a circuit configured for determining a difference between the compensation signal and the sensed signal to provide a difference signal, and for generating said output signal in dependence upon the determined difference signal;

wherein the sensor winding and the compensation winding are arranged relatively to said magnetic field generator so that when said magnetic field generator generates a magnetic field in response to a current to be sensed, said sensor winding and said compensation winding are non-ferromagnetically coupled to said magnetic field generator.

49. A current sensor comprising:

a magnetic field generator for receiving a current to be sensed and for generating in response thereto a corresponding local magnetic field; and a sensor configured for sensing the local magnetic field generated by said magnetic field generator and for outputting an output signal that is indicative of the current to be sensed, the sensor comprising (a) a sensor winding having one or more turns of conductor which define an effective magnetic centre of the sensor winding, for sensing magnetic fields and for generating a sensed signal which varies with the sensed magnetic field, and (b) a compensation winding having one or more turns of conductor which define an effective magnetic centre of the compensation winding, for sensing magnetic fields and for generating a compensation signal which varies with the sensed magnetic field; and circuitry for determining a difference between the compensation signal and the sensed signal to provide a difference signal, and for generating said output signal in dependence upon the determined difference signal;

wherein the sensor winding and the compensation winding are arranged so that they are formed as conductive tracks on a common printed circuit board.

50. A current sensor according to claim 49 in which the tracks enclose an air core through the printed circuit board.

51. An electricity meter comprising a current sensor according to claim 50, further comprising:

a first circuit configured for providing a measure of a voltage of an electricity supply providing the current to be sensed by said current sensor; and a second circuit configured for determining and outputting an indication of an electrical characteristic of a load to which the sensed current is delivered in dependence upon the current measure and the voltage measure.

52. An electricity meter according to claim 51, wherein said current sensor, said first circuit and said second circuit are implemented on a common printed circuit board.

* * * * *